United States Patent
Nguyen et al.

(10) Patent No.: US 7,682,984 B2
(45) Date of Patent: Mar. 23, 2010

(54) INTERFEROMETER ENDPOINT MONITORING DEVICE

(75) Inventors: Khiem K. Nguyen, San Jose, CA (US); Peter Satitpunwaycha, Sunnyvale, CA (US); Alfred W. Mak, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 11/531,467

(22) Filed: Sep. 13, 2006

(65) Prior Publication Data

US 2007/0023393 A1    Feb. 1, 2007

Related U.S. Application Data

(63) Continuation of application No. 10/672,420, filed on Sep. 26, 2003, now abandoned.

(51) Int. Cl.
*H01L 21/302* (2006.01)

(52) U.S. Cl. .............. 438/717; 438/706; 438/736; 438/740; 430/323

(58) Field of Classification Search ........... 438/7, 438/8, 706, 710, 712, 714, 717, 736; 430/316, 430/323
See application file for complete search history.

(56) References Cited

U.S. PATENT DOCUMENTS

| | | | | |
|---|---|---|---|---|
| 4,058,430 A | 11/1977 | Suntola et al. | ............... | 156/611 |
| 4,389,973 A | 6/1983 | Suntola et al. | ............... | 118/725 |
| 4,413,022 A | 11/1983 | Suntola et al. | ............ | 427/255.2 |
| 4,611,919 A * | 9/1986 | Brooks et al. | ................ | 356/504 |
| 4,834,831 A | 5/1989 | Nishizawa et al. | ........... | 156/611 |
| 4,993,357 A | 2/1991 | Scholz | ........................ | 118/715 |
| 5,225,366 A | 7/1993 | Yoder | ........................ | 437/108 |
| 5,281,274 A | 1/1994 | Yoder | ........................ | 118/697 |
| 5,294,286 A | 3/1994 | Nishizawa et al. | .......... | 156/610 |
| 5,360,738 A | 11/1994 | Jones et al. | .................... | 436/30 |
| 5,374,570 A | 12/1994 | Nasu et al. | ..................... | 437/40 |
| 5,433,651 A * | 7/1995 | Lustig et al. | ..................... | 451/6 |
| 5,441,703 A | 8/1995 | Jurgensen | ................... | 422/129 |
| 5,443,647 A | 8/1995 | Aucoin et al. | ................ | 118/723 |
| 5,480,818 A | 1/1996 | Matsumoto et al. | ........... | 437/40 |
| 5,483,919 A | 1/1996 | Yokoyama et al. | ............. | 117/89 |
| 5,503,875 A | 4/1996 | Imai et al. | ................. | 427/255.3 |

(Continued)

FOREIGN PATENT DOCUMENTS

EP    1 167 569    1/2002

(Continued)

OTHER PUBLICATIONS

J.P. Stagg, J. Christer, E. J. Thrush and J. Crawley, "Measurement and Control of Reagent Concentrations in MOCVD Reactor Using Ultrasonics," Journal of Crystal Growth 120(1992) pp. 98-102.

(Continued)

*Primary Examiner*—Lan Vinh
(74) *Attorney, Agent, or Firm*—Patterson & Sheridan, LLP

(57) ABSTRACT

A photomask etch chamber, which includes a substrate support member disposed inside the chamber. The substrate support member is configured to support a photomask substrate. The chamber further includes a ceiling disposed on the chamber and an endpoint detection system configured to detect a peripheral region of the photomask substrate.

19 Claims, 3 Drawing Sheets

U.S. PATENT DOCUMENTS

| | | | |
|---|---|---|---|
| 5,674,786 A | 10/1997 | Turner et al. | 437/225 |
| 5,711,811 A | 1/1998 | Suntola et al. | 118/711 |
| 5,796,116 A | 8/1998 | Nakata et al. | 257/66 |
| 5,807,792 A | 9/1998 | Ilg et al. | 438/758 |
| 5,835,677 A | 11/1998 | Li et al. | 392/401 |
| 5,855,680 A | 1/1999 | Soininen et al. | 118/719 |
| 5,866,795 A | 2/1999 | Wang et al. | 73/1.36 |
| 5,879,459 A | 3/1999 | Gadgli et al. | 118/715 |
| 5,916,365 A | 6/1999 | Sherman | 117/92 |
| 5,923,056 A | 7/1999 | Lee et al. | 257/192 |
| 6,015,590 A | 1/2000 | Suntola et al. | 427/255.23 |
| 6,015,917 A | 1/2000 | Bhandari et al. | 556/12 |
| 6,042,652 A | 3/2000 | Hyun et al. | 118/719 |
| 6,084,302 A | 7/2000 | Sandhu | 257/751 |
| 6,124,158 A | 9/2000 | Dautartas et al. | 438/216 |
| 6,139,700 A | 10/2000 | Kang et al. | 204/192.17 |
| 6,144,060 A | 11/2000 | Park et al. | 257/310 |
| 6,159,297 A | 12/2000 | Herchen et al. | 118/708 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,231,672 B1 | 5/2001 | Choi et al. | 118/715 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 |
| 6,306,216 B1 | 10/2001 | Kim et al. | 118/725 |
| 6,342,277 B1 | 1/2002 | Sherman | 427/562 |
| 6,348,376 B2 | 2/2002 | Lim et al. | 438/253 |
| 6,358,829 B2 | 3/2002 | Yoon et al. | 438/597 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,399,491 B2 | 6/2002 | Jeon et al. | 438/680 |
| 6,416,577 B1 | 7/2002 | Suntola et al. | 117/88 |
| 6,416,822 B1 | 7/2002 | Chiang et al. | 427/561 |
| 6,428,859 B1 | 8/2002 | Chiang et al. | 427/457 |
| 6,447,607 B2 | 9/2002 | Soininen et al. | 117/200 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,733 B2 | 11/2002 | Raaijmakers | 438/633 |
| 6,511,539 B1 | 1/2003 | Raaijmakers | 117/102 |
| 6,551,406 B2 | 4/2003 | Kilpi | 118/728 |
| 2001/0000866 A1 | 5/2001 | Sneh et al. | 118/723 |
| 2001/0002280 A1 | 5/2001 | Sneh | 427/255.28 |
| 2001/0003084 A1* | 6/2001 | Finarov | 451/6 |
| 2001/0009140 A1 | 7/2001 | Bondestam et al. | 118/725 |
| 2001/0009695 A1 | 7/2001 | Saanila et al. | 427/255.39 |
| 2001/0010255 A1* | 8/2001 | Kijima | 156/345 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0009544 A1 | 1/2002 | McFeely et al. | 427/248.1 |
| 2002/0017364 A1* | 2/2002 | Luo et al. | 156/345 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0041931 A1 | 4/2002 | Suntola et al. | 427/255.28 |
| 2002/0048635 A1 | 4/2002 | Kim et al. | 427/331 |
| 2002/0052097 A1 | 5/2002 | Park | 438/507 |
| 2002/0066411 A1 | 6/2002 | Chiang et al. | 118/724 |
| 2002/0068458 A1 | 6/2002 | Chiang et al. | 438/694 |
| 2002/0073924 A1 | 6/2002 | Chiang et al. | 118/723 R |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0082296 A1 | 6/2002 | Verschoor et al. | 514/557 |
| 2002/0086106 A1 | 7/2002 | Park et al. | 427/248.1 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0106536 A1 | 8/2002 | Lee et al. | 428/702 |
| 2002/0108570 A1 | 8/2002 | Lindfors | 118/715 |
| 2002/0134307 A1 | 9/2002 | Choi | 118/715 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/148.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0197402 A1 | 12/2002 | Chiang et al. | 427/255.39 |
| 2003/0004723 A1 | 1/2003 | Chihara | 704/260 |
| 2003/0013320 A1 | 1/2003 | Kim et al. | 438/778 |
| 2003/0031807 A1 | 2/2003 | Elers et al. | 427/569 |
| 2003/0042630 A1 | 3/2003 | Babcoke et al. | 261/121.1 |
| 2003/0049942 A1 | 3/2003 | Haukka et al. | 438/778 |
| 2003/0072975 A1 | 4/2003 | Shero et al. | 428/704 |
| 2003/0075273 A1 | 4/2003 | Kilpela et al. | 156/345.33 |
| 2003/0075925 A1 | 4/2003 | Lindfors et al. | 285/367 |

FOREIGN PATENT DOCUMENTS

| | | |
|---|---|---|
| GB | 2 355 727 | 5/2001 |
| JP | 57149732 | 9/1982 |
| JP | 58098917 | 6/1983 |
| JP | 4291916 | 9/1992 |
| JP | 5047666 | 2/1993 |
| JP | 5206036 | 8/1993 |
| JP | 5234899 | 9/1993 |
| JP | 5270997 | 10/1993 |
| JP | 6224138 | 5/1994 |
| JP | 11058225 | 3/1999 |
| JP | 2000319772 | 3/2000 |
| JP | 2001020075 | 11/2000 |
| JP | 2001111000 | 4/2001 |
| JP | 2001160576 | 6/2001 |
| JP | 2001160576 A * | 6/2001 |
| JP | 2001172767 | 6/2001 |
| JP | 2001217227 | 8/2001 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 0016377 | 3/2000 |
| WO | WO 00/54320 | 9/2000 |

| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 02/08485 | 1/2002 |
| WO | WO 02/08488 | 1/2002 |
| WO | WO 02/43115 | 5/2002 |
| WO | WO 02/45167 | 6/2002 |

OTHER PUBLICATIONS

"MultiGas™ 2030," MKS Instruments, Inc., Bulletin 2030-04/02.

Kukli, et al., "Tailoring the Dielectric Properties of $HfO_2$-$Ta_2$-$O_2$ Nanolaminates," Applied Physics Letters, vol. 68, No. 26, Jun. 24, 1996; p. 3737-9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al., "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Ritala, M., et al., "Chemical Vapor Deposition," Jan. 1999, p. 6-9.

Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); p. 2016-20.

Niinisto, et al. "Synthesis of Oxide Thin Films and Overlayers by Atomic Layer Epitaxy for Advanced Applications," Materials Science and Engineering B41 (1996) 23-29.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

* cited by examiner

INTERFEROMETER ENDPOINT MONITORING DEVICE

CROSS-REFERENCE TO RELATED APPLICATION

This application is a continuation of U.S. patent application Ser. No. 10/672,420, filed Sep. 26, 2003 (APPM/8349), now abandoned which is incorporated herein by reference.

BACKGROUND OF THE INVENTION

1. Field of the Invention

Embodiments of the present invention generally relate to the fabrication of integrated circuits and to the fabrication of photomasks useful in the manufacture of integrated circuits.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.15 µm and even 0.13 µm feature sizes, and tomorrow's plants soon will be producing devices having even smaller geometries.

The increasing circuit densities have placed additional demands on processes used to fabricate semi-conductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates.

High aspect ratio features are conventionally formed by patterning a surface of a substrate to define the dimensions of the features and then etching the substrate to remove material and define the features. To form high aspect ratio features with a desired ratio of height to width, the dimensions of the features are required to be formed within certain parameters, which are typically defined as the critical dimensions of the features. Consequently, reliable formation of high aspect ratio features with desired critical dimensions requires precise patterning and subsequent etching of the substrate.

Photolithography is a technique used to form precise patterns on the substrate surface. The patterned substrate surface is etched to form the desired device or features. Photolithography techniques use light patterns and resist materials deposited on a substrate surface to develop the patterns on the substrate surface prior to the etching process. In conventional photolithographic processes, a resist is applied on the layer to be etched, and the features to be etched in the layer, such as contacts, vias, or interconnects, are defined by exposing the resist to a pattern of light through a photolithographic reticle having a photomask layer disposed thereon. The photomask layer corresponds to the desired configuration of features. A light source emitting ultraviolet (UV) light or low X-ray light, for example, may be used to expose the resist to alter the composition of the resist. Generally, the exposed resist material is removed by a chemical process to expose the underlying substrate material. The exposed underlying substrate material is then etched to form the features in the substrate surface while the retained resist material remains as a protective coating for the unexposed underlying substrate material.

Photolithographic reticles typically include a substrate made of an optically transparent material, such as quartz (i.e., silicon dioxide, SiO2), having an opaque light-shielding layer of metal, typically chromium, disposed on the surface of the substrate. The light-shielding layer is patterned to correspond to the features to be transferred to the substrate. Generally, conventional photolithographic reticles are fabricated by first depositing a thin metal layer on a substrate comprising an optically transparent material, such as quartz, and depositing a resist layer on the thin metal layer. The resist is then patterned using conventional laser or electron beam patterning equipment to define the critical dimensions to be transferred to the metal layer. The metal layer is then etched to remove the metal material not protected by the patterned resist, thereby exposing the underlying material and forming a patterned photomask layer. Photomask layers allow light to pass therethrough in a precise pattern onto the substrate surface.

During processing, endpoint data from the patterns disposed on the photolithographic reticles may be used to determine whether the process meets the desired recipe. Each photolithographic reticle generally has its own set of patterns. Consequently, different photolithographic reticles operating under the same recipe generally yield different endpoint data, thereby making it difficult to determine whether the processing conditions in the chamber meet the desired recipe.

Therefore, a need exists in the art for an improved apparatus and method for generating endpoint data that would be consistent for each photolithographic reticle.

SUMMARY OF THE INVENTION

Embodiments of the present invention are generally directed to a photomask etch chamber, which includes a substrate support member disposed inside the chamber. The substrate support member is configured to support a photomask substrate. The chamber further includes a ceiling disposed on the chamber and an endpoint detection system configured to detect a peripheral region of the photomask substrate.

In one embodiment, the endpoint detection system is disposed through a peripheral region of the ceiling and positioned directly above the peripheral region of the photomask substrate.

In another embodiment, the endpoint detection system is disposed through a peripheral region of the substrate support member and positioned directly below the peripheral region of the photomask substrate.

In yet another embodiment, the endpoint detection system is an interferometer endpoint detection system.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims.

DETAILED DESCRIPTION

Figure 1:
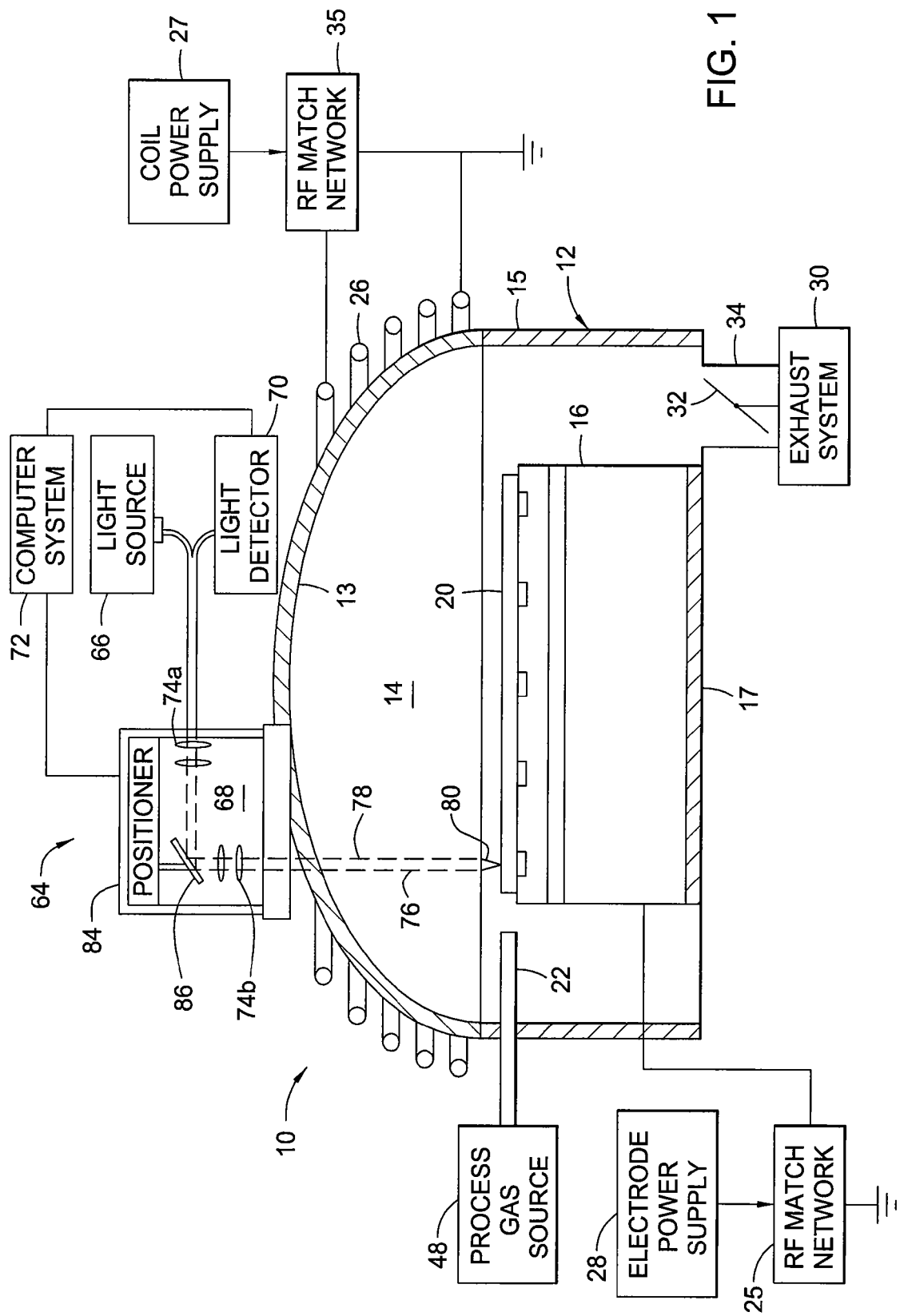
FIG. 1 illustrates a schematic cross sectional view of an inductively coupled plasma etch chamber in accordance with one embodiment of the invention.

FIG. 1 is a schematic cross sectional view of an inductively coupled plasma etch chamber 10 in accordance with one embodiment of the invention. Suitable inductively coupled plasma etch chambers include the ETEC Tetra™ II photomask etch chamber available from ETEC of Hayward, California, or optionally, the Decoupled Plasma Source (DPS™) chamber available from Applied Materials, Inc., of Santa Clara, Calif. Other process chambers may be used in connection with embodiments of the invention, including, for example, capacitive coupled parallel plate chambers and magnetically enhanced ion etch chambers, as well as inductively coupled plasma etch chambers of different designs.

The processing chamber 10 generally includes a cylindrical sidewall or chamber body 12, an energy transparent dome ceiling 13 mounted on the body 12, and a chamber bottom 17. The ceiling 13 may be flat, rectangular, arcuate, conical, dome or multi-radius shaped. An inductive coil 26 is disposed around at least a portion of the dome 13. The chamber body 12 and the chamber bottom 17 of the processing chamber 10 can be made of a metal, such as anodized aluminum, and the ceiling 13 can be made of an energy transparent material such as a ceramic or other dielectric material.

A substrate support member 16 is disposed in the processing chamber 10 to support a substrate 20 during processing. The support member 16 may be a conventional mechanical or electrostatic chuck with at least a portion of the support member 16 being electrically conductive and capable of serving as a process bias cathode. While not shown, a reticle adapter may be used to secure the reticle on the support member 16. The reticle adapter generally includes a lower portion milled to cover an upper portion of the support member and a top portion having an opening that is sized and shaped to hold a reticle. A suitable reticle adapter is disclosed in U.S. Pat. No. 6,251,217, issued on Jun. 26, 2001, which is incorporated herein by reference to the extent not inconsistent with aspects and claims of the invention.

Processing gases are introduced into the processing chamber 10 from a process gas source 48 through a gas distributor 22 peripherally disposed about the support member 16. Mass flow controllers (not shown) for each processing gas, or alternatively, for mixtures of the processing gas, are disposed between the processing chamber 10 and the process gas source 48 to regulate the respective flow rates of the process gases.

A plasma zone 14 is defined by the process chamber 10, the substrate support member 16 and the ceiling 13. A plasma is formed in the plasma zone 14 from the processing gases using a coil power supply 27 which supplies power to the inductor coil 26 to generate an electromagnetic field in the plasma zone 14 through an RF match network 35. The support member 16 may include an electrode disposed therein, which is powered by an electrode power supply 28 and generates a capacitive electric field in the processing chamber 10 through an RF match network 25. Typically, RF power is applied to the electrode in the support member 16 while the body 12 is electrically grounded. The capacitive electric field is transverse to the plane of the support member 16, and influences the directionality of charged species more normal to the substrate 20 to provide more vertically oriented anisotropic etching of the substrate 20.

Process gases and etchant byproducts are exhausted from the process chamber 10 through an exhaust system 30. The exhaust system 30 may be disposed in the bottom 17 of the processing chamber 10 or may be disposed in the body 12 of the processing chamber 10 for removal of processing gases. A throttle valve 32 is provided in an exhaust port 34 for controlling the pressure in the processing chamber 10.

FIG. 1 further illustrates an endpoint detection system 64 connected to the processing chamber 10 in accordance with one embodiment of the invention. The endpoint detection system 64 may be an interferometer endpoint (IEP) detection system. The endpoint detection system 64 is positioned through the peripheral portion of the ceiling 13, i.e., over a peripheral portion of the substrate. In this manner, the endpoint detection system 64 has a direct line of sight to detect the peripheral region 315 of the substrate surface (shown in FIG. 3).

The endpoint detection system 64 generally comprises a light source 66 for emitting a light beam, a focusing assembly 68 for focusing an incident light beam 76, which illuminates an area or spot 80 on the surface of substrate 20, and a light detector 70 that measures the intensity of a reflected light beam 78, which is reflected from the beam spot 80 on substrate 20 surface. A computer 72 calculates portions of the real-time measured waveform spectra of light reflected from the beam spot 80 on substrate 20 and compares these with a stored characteristic waveform pattern.

The light source 66 comprises a monochromatic or polychromatic light source that generates an incident light beam 76, which illuminates a beam spot 80 on substrate 20. When the layer onto which the illuminated spot 80 is directed has a sufficient thickness, a reflected light beam 78 is reflected from beam spot 80. The intensity of the incident light beam 76 is selected to be sufficiently high to provide a reflected light beam 78 which has a measurable intensity. In one version, the light source 66 provides polychromatic light, such as an Hg—Cd lamp, which generates an emission spectrum of light in wavelengths from about 200 nm to about 600 nm. The polychromatic light source 66 can be filtered to provide an incident light beam 76 having selected frequencies. Color filters can be placed in front of the light detector 70 to filter out all wavelengths except for the desired wavelength of light, prior to measuring the intensity of the reflected light beam 78 entering the light detector 70. The light source 66 can also comprise a flash lamp or a monochromatic light source that provides a selected wavelength of light, for example, an He—Ne or ND-YAG laser.

One or more convex focusing lenses 74a, 74b may be used to focus an incident light beam 76 from the light source 66 to form a beam spot 80 on the substrate surface, and to focus the reflected light beam 78 back on the active surface of light detector 70. The size or area of the beam spot 80 should be sufficiently large to compensate for variations in surface topography of the substrate 20 and device design features. This enables detection of etch endpoints for high aspect ratio features having small openings, such as vias or deep narrow trenches, which may be densely present or more isolated. The area of the reflected light beam should be sufficiently large to activate a large portion of the active light-detecting surface of the light detector 70. The incident and reflected light beams 76, 78 are directed through a transparent window 82 in the process chamber 10 that allows the light beams to pass in and out of the processing environment.

The diameter of the beam spot 80 is generally about 2 mm to about 10 mm. However, if the beam spot 80 encompasses large isolated areas of the substrate, containing only a small number of etched features, it may be necessary to use a larger beam spot in order to encompass a greater number of etched features. The size of the beam spot can therefore be optimized, depending on the design features for a particular device.

Optionally, a light beam positioner 84 may be used to move the incident light beam 76 across the substrate 20 to locate a suitable portion of the substrate surface on which to position the beam spot 80 to monitor an etching process. The light beam positioner 84 may include one or more primary mirrors 86 that rotate at small angles to deflect the light beam from the light source 66 onto different positions of the substrate surface. Additional secondary mirrors may be used (not shown) to intercept the reflected light beam 78 that is reflected from the substrate 20 surface and focus the reflected light beam 78 on the light detector 70. The light beam positioner 84 may also be used to scan the light beam in a raster pattern across the substrate 20 surface. In this version, the light beam positioner 84 comprises a scanning assembly consisting of a movable stage (not shown), upon which the light source 66, the focusing assembly 68 and the detector 70 are mounted. The movable stage can be moved through set intervals by a drive mechanism, such as a stepper motor, to move the beam spot 80 across the substrate 20 surface.

The light detector 70 comprises a light-sensitive electronic component, such as a photovoltaic cell, photodiode, or phototransistor, which provides a signal in response to a measured intensity of the reflected light beam 78 that is reflected from the substrate 20 surface. The signal can be in the form of a change in the level of a current passing through an electrical component or a change in a voltage applied across an electrical component. The reflected light beam 78 undergoes constructive and/or destructive interference which increases or decreases the intensity of the light beam, and the light detector 70 provides an electrical output signal in relation to the measured intensity of the reflected light beam 78. The electrical output signal is plotted as a function of time to provide a waveform spectra having numerous waveform patterns corresponding to the varying intensity of the reflected light beam 78.

A computer program on a computer system 72 compares the shape of the measured waveform pattern of the reflected light beam 78 to a stored characteristic waveform pattern and determines the endpoint of the etching process when the measured waveform pattern is the same as the characteristic waveform pattern. As such, the period of interference signal may be used to calculate the depth and etch rate. The program may also operate on the measured waveform to detect a characteristic waveform, such as, an inflection point. The operations can be simple mathematic operations, such as evaluating a moving derivative to detect an inflection point.

Figure 3:
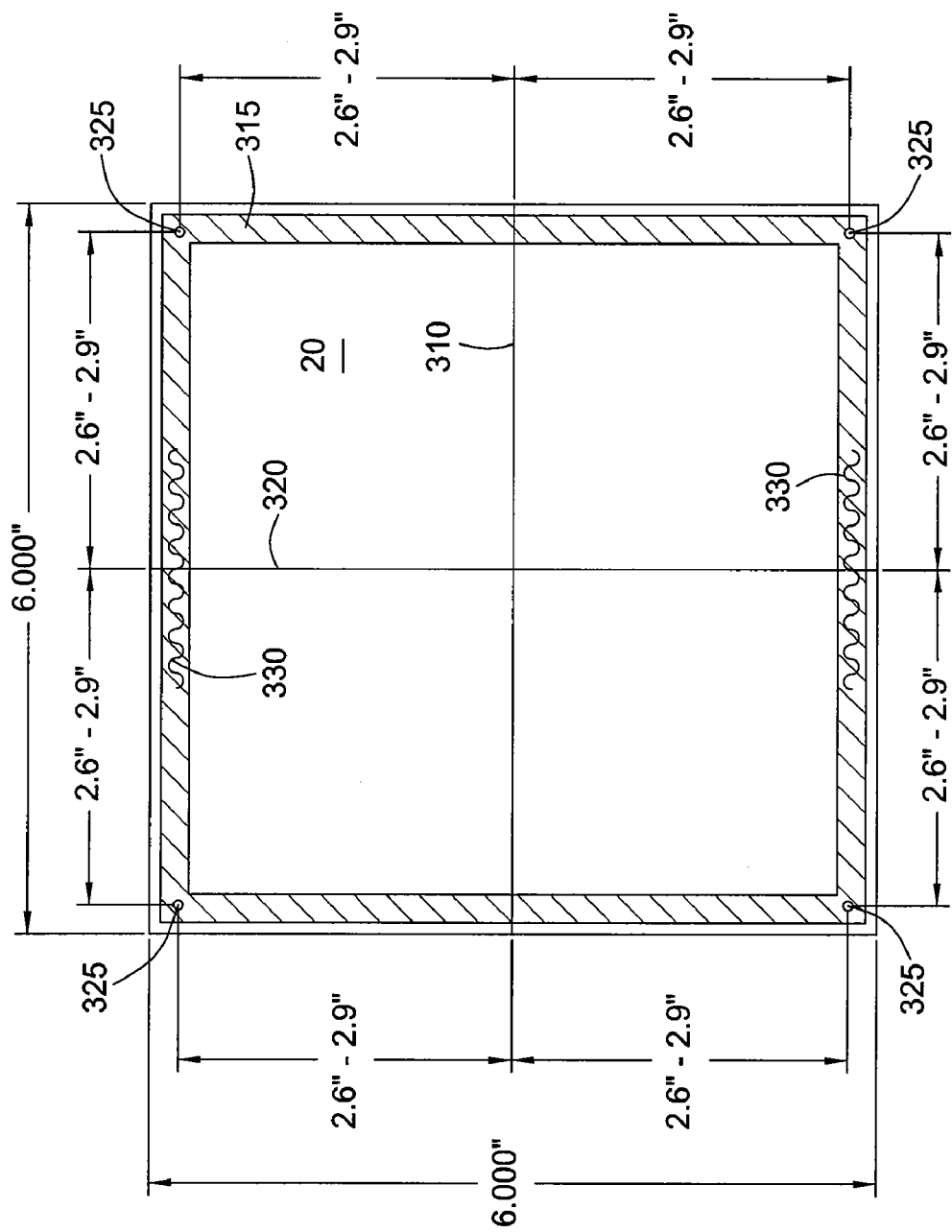
FIG. 3 illustrates a top view of a substrate in accordance with one embodiment of the invention.

The endpoint detection system 64 is configured to detect patterns disposed in any region of the substrate surface. In one embodiment of the invention, the endpoint detection system 64 is used to detect the endpoint of one or more test patterns 330 disposed on the peripheral region 315 of the substrate surface or on the corners 325 of the substrate surface. As such, the endpoint detection system 64 may be disposed directly above the peripheral region 315 or corner regions 325 of the substrate surface. For example, in detecting a 6 inch by 6 inch substrate, the endpoint detection system 64 may be disposed about 2.6-2.9 inches from a horizontal center line 310 of the substrate 20 and about 2.6-2.9 inches from a vertical center line 320 of the substrate 20, as illustrated in FIG. 3.

The light beams reflected from each substrate having the same test patterns are configured to have the same waveform patterns when detected by the endpoint detection system 64. In this manner, the waveform patterns derived from the same test patterns may be used to determine whether the chamber is operating according to a particular recipe.

Figure 2:
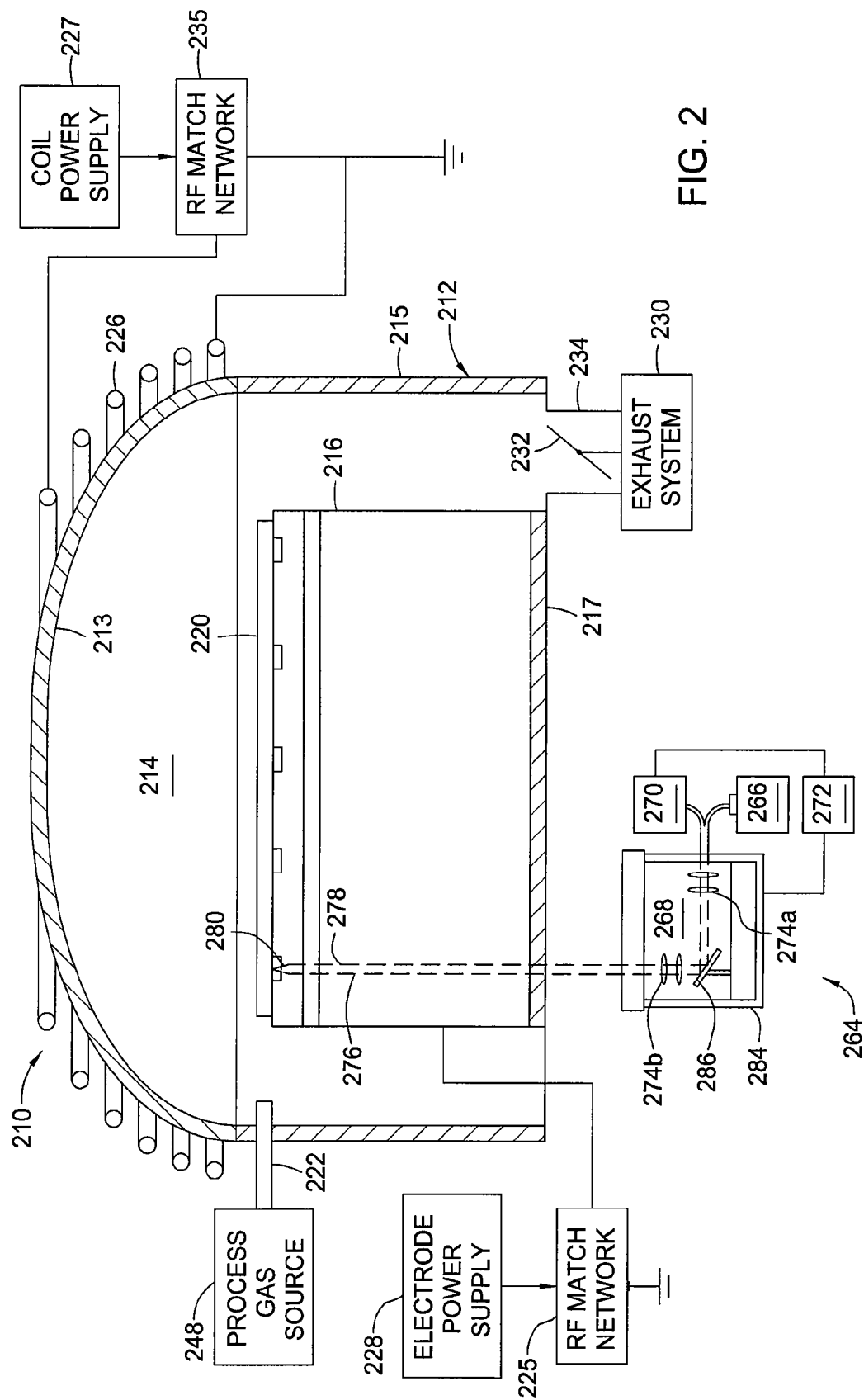
FIG. 2 illustrates an endpoint detection system in accordance with another embodiment of the invention.

FIG. 2 illustrates an endpoint detection system 264 in accordance with another embodiment of the invention. The endpoint detection system 264 is disposed through the substrate support member 216. The endpoint detection system 264 comprises a light source 266 for emitting a light beam, a focusing assembly 268 for focusing an incident light beam 276, which illuminates an area or spot 280 on the bottom surface of substrate 220, and a light detector 270 that measures the intensity of a reflected light beam 278 that is reflected from the beam spot 280 on substrate bottom surface. A computer 272 calculates portions of the real-time measured waveform spectra of light reflected from the beam spot 280 on substrate 220 and compares these with a stored characteristic waveform pattern. Detailed description of the light source 66, the focusing assembly 68, the light detector 70, the computer 72, and other components of the endpoint detection system 64 may also apply to the light source 266, the focusing assembly 268, the light detector 270, the computer 272, and other components of the endpoint detection system 264.

While the foregoing is directed to embodiments of the present invention, other and further embodiments of the invention may be devised without departing from the basic scope thereof, and the scope thereof is determined by the claims that follow.

What is claimed is:

1. A method for monitoring substrate etching process, comprising:
    placing a substrate having one or more test patterns disposed on a peripheral region of the substrate in a square opening of a substrate support in a plasma etching chamber, the substrate support having an endpoint detection system disposed therein, the endpoint detection system disposed in a plurality of locations within a quadrilateral band, wherein at least one of the plurality of locations is in a corner of the square opening;
    etching one or more of the test patterns; and
    detecting a predetermined endpoint of the etching step by sensing a change in a characteristic of the one or more test patterns from a backside of the substrate by the endpoint detection system.

2. The method of claim 1, wherein placing the substrate further comprises:
    aligning one or more of the test patterns over the endpoint detection system.

3. The method of claim 1, wherein detecting further comprises:
    performing an interferometric endpoint detection routine from the backside of the substrate.

4. A method for monitoring substrate etching process:
    placing a substrate on center of a substrate support disposed in a plasma etching chamber, the substrate support having an endpoint detection system positioned in a corner of a square substrate receiving opening of the substrate support in a position to view a backside of the substrate through the substrate support;

etching the substrate in the processing chamber; and optically detecting an endpoint of the etching step from one or more test patterns disposed on a periphery region of the substrate from the backside of the substrate using the endpoint detection system.

5. The method of claim 4, wherein the step of optically detecting the endpoint further comprises, performing an interferometric endpoint routine.

6. The method of claim 4, wherein the step of optically detecting the endpoint further comprises:

directing a light beam through the substrate support to the substrate; and measuring that intensity of a light beam reflected from a substrate.

7. The method of claim 4, wherein the step of optically detecting further comprises:

focusing a light to a spot on the backside of the substrate.

8. The method of claim 7, wherein the step of focusing the light further comprises:

directing the light about 2.6 to 2.9 inches off center of the substrate.

9. The method of claim 7 further comprising:

generating light from at least one monochromatic or polychromatic light source.

10. The method of claim 4, wherein the step of optically detecting further comprises:

illuminating a spot having a diameter of about 2 mm to about 10 mm on the backside of the substrate.

11. A method for monitoring substrate etching process, comprising:

placing a square substrate having one or more test patterns disposed on a periphery region of the substrate on a substrate support having an adapter having a square substrate receiving pocket, the substrate support having an endpoint detection system disposed in a peripheral portion of the substrate support;

etching one or more of the test patterns disposed on the substrate support in a plasma etching chamber;

directing light from the endpoint detection system through the pocket of the adapter to the test patterns through a bottom surface of the substrate, wherein the light is directed to the substrate from a corner of the adapter and from a location along an edge of the adapter;

measuring a reflected light from the test patterns to the endpoint detection system; and determining an etch endpoint from the measured reflected light.

12. The method of claim 11, wherein the test patterns are disposed on the peripheral region of the substrate outside of a region of the substrate wherein features are formed.

13. The method of claim 11, wherein placing the substrate further comprises:

aligning one or more of the test patterns disposed on the peripheral region of the substrate over the endpoint detection system disposed in the periphery region of the substrate support.

14. The method of claim 11, wherein directing the light further comprises:

emitting the light in a direct line of sight from the endpoint detection system through the substrate support to the test patterns disposed on the peripheral region of the substrate.

15. The method of claim 11, wherein placing the substrate further comprises:

aligning the test pattern with the endpoint detection system that is positioned to direct the light to illuminate the spot on the substrate.

16. The method of claim 11, wherein the endpoint detection system is positioned to direct the light to illuminate the spot on the substrate.

17. The method of claim 11, wherein emitting the incident light from the endpoint detection system further comprises, performing an interferometric endpoint routine.

18. The method of claim 11, wherein the test patterns are disposed on corners of the substrate.

19. The method of claim 18, wherein the endpoint detection system is positioned to direct the light to illuminate the test patterns disposed on the corners of the substrate.

* * * * *